United States Patent [19]

Sheng

[11] Patent Number: 5,771,153
[45] Date of Patent: Jun. 23, 1998

[54] CPU HEAT DISSIPATING APPARATUS

[76] Inventor: Lin Chun Sheng, 31, Sec. 1, Min-I Rd., Wu-Ku Hsiang, Taipei, Taiwan

[21] Appl. No.: 857,334

[22] Filed: May 16, 1997

[51] Int. Cl.⁶ ..................................................... H05K 7/20
[52] U.S. Cl. ......................... 361/697; 165/80.3; 165/185; 174/16.3; 257/719; 361/704
[58] Field of Search ................................ 165/80.2, 80.3, 165/185; 174/16.3; 257/718–719, 727; 361/694, 695, 697, 704, 707, 709–710, 715, 718, 722

[56] References Cited

U.S. PATENT DOCUMENTS

| | | | |
|---|---|---|---|
| 5,309,983 | 5/1994 | Bailey | 361/697 |
| 5,570,271 | 10/1996 | Lauochkin | 361/704 |
| 5,594,623 | 1/1997 | Schwegler | 361/697 |
| 5,602,719 | 2/1997 | Kinion | 361/704 |
| 5,684,676 | 11/1997 | Lin | 361/704 |

*Primary Examiner*—Gregory D. Thompson
*Attorney, Agent, or Firm*—A & J

[57] ABSTRACT

A CPU heat dissipating apparatus includes a heat sink attached to a CPU shell for dissipating of heat from it, an elongated clamping plate mounted in a longitudinal passage between two arrays of radiating fins on the heat sink and hooked on the CPU shell to secure the heat sink and the CPU shell together, and a lock bolt inserted into an oblong mounting hole on the elongated clamping plate and a corresponding oblong mounting hole on the heat sink and a corresponding oblong mounting hole on the CPU shell and then turned through 90 degrees to lock the elongated clamping plate and the heat sink and the CPU shell together.

3 Claims, 4 Drawing Sheets

CPU HEAT DISSIPATING APPARATUS

BACKGROUND OF THE INVENTION

1. Field of the Invention

This invention relates to a CPU heat dissipating apparatus adapted for dissipating heat from a CPU of for example a computer.

2. Description of the Prior Art

When a computer is operated, its CPU will produce heat. During the operation, heat must be quickly carried away from the CPU. If heat cannot be quickly carried away, the CPU may be unable to function properly. Various heat sinks have been disclosed for this purpose. These heat sinks commonly use retainer means for securing to the CPU mount or CPU shell. However, these retainer means cannot keep heat sinks from displacement during a delivery.

SUMMARY OF THE INVENTION

This invention relates to a CPU heat dissipating apparatus adapted for dissipating heat from a CPU of for example a computer.

It is the main object of the present invention to provide a CPU heat dissipating apparatus which can be firmly secured in place to effectively dissipate heat from the CPU. According to one aspect of the present invention, the CPU heat dissipating apparatus comprises a heat sink attached to a CPU shell for dissipating of heat from it, an elongated clamping plate mounted in a longitudinal passage between two arrays of radiating fins on the heat sink and hooked on the CPU shell to secure the heat sink and the CPU shell together, and a lock bolt inserted into an oblong mounting hole on the elongated clamping plate and a corresponding oblong mounting hole on the heat sink and a corresponding oblong mounting hole on the CPU shell and then turned through 90 degrees to lock the elongated clamping plate and the heat sink and the CPU shell together. According to another aspect of the present invention, a wing guide is provided and mounted on the heat sink for guiding currents of air through the heat sink. The wing guide comprises a plurality of inward hooks bilaterally disposed at two opposite ends and respectively hooked on respective hooked portions on fin ribs of the radiating fins of the heat sink, and a center air hole which receives a fan.

BRIEF DESCRIPTION OF THE DRAWINGS

FIG. 2A is an enlarged view of a part of FIG. 2;

DETAILED DESCRIPTION OF THE PREFERRED EMBODIMENT

Figure 1:
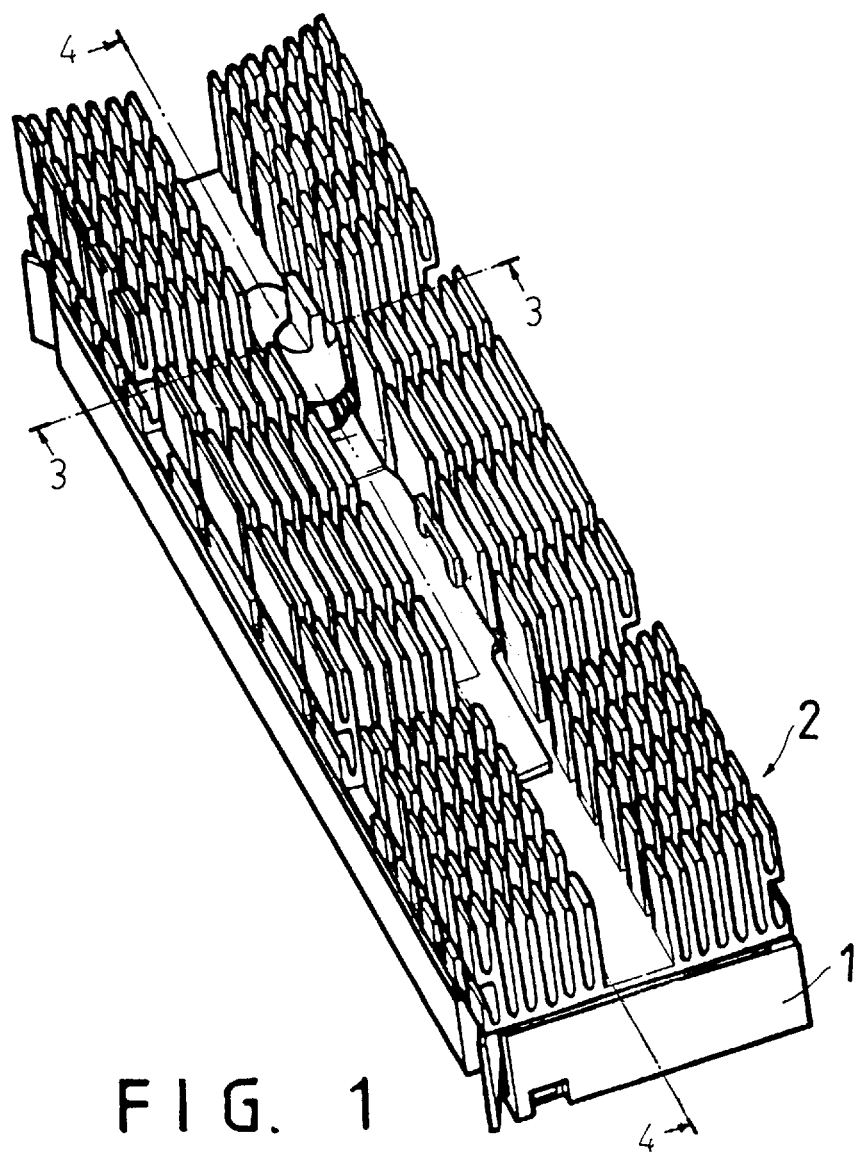
FIG. 1 is an elevational view of the present invention, showing the heat sink fastened to the CPU shell.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

Figure 2:
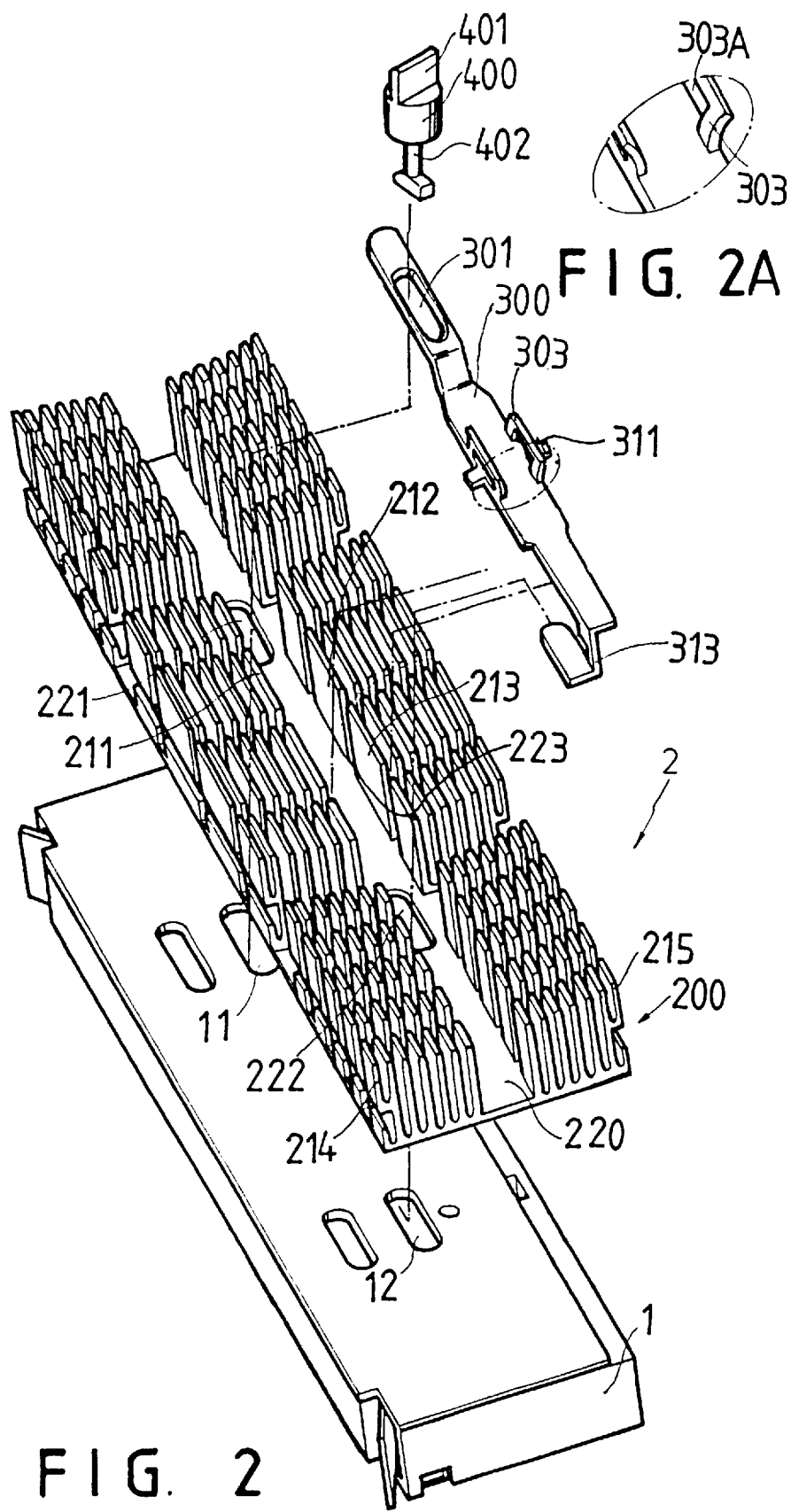
FIG. 2 is an exploded view of FIG. 1.

Referring to FIGS. 1 and 2, a CPU heat dissipating apparatus 2 is mounted on a CPU shell 1 for dissipating of heat from it. The CPU heat dissipating apparatus 2 comprises a heat sink 200, an elongated clamping plate 300, and a lock bolt 400. The heat sink 200 is fastened to the CPU shell 1 by the elongated clamping plate 300 and the lock bolt 400, comprising a plurality of longitudinally and transversely aligned radiating fins 211, 212, 213, 214, 215 . . . arranged into two separated arrays, a longitudinal passage 220 defined between the two separated arrays of radiating fins 211, 212, 213, 214, 215, and two oblong mounting holes 221, 222 in the longitudinal passage 220. The elongated clamping plate 300 comprises an oblong mounting hole 301 at one end, a downward hook 313 at an opposite end, two upright springy frames 303 bilaterally disposed in the middle, and two retainer strips 311 respectively and horizontally extended from the upright spring frames 303 in reversed directions. The gap between the two upright springy frames 303 is approximately equal to the width of the longitudinal passage 220. Further, an opening 303A is made through each upright springy frame 303 (see FIG. 2A). The design of the opening 303A diminishes material, and makes the respective upright springy frame 303 more springy. The lock bolt 400 comprises a flat finger plate 401 raised from the top, and a T-rod 402 invertedly disposed at the bottom.

Figure 3:
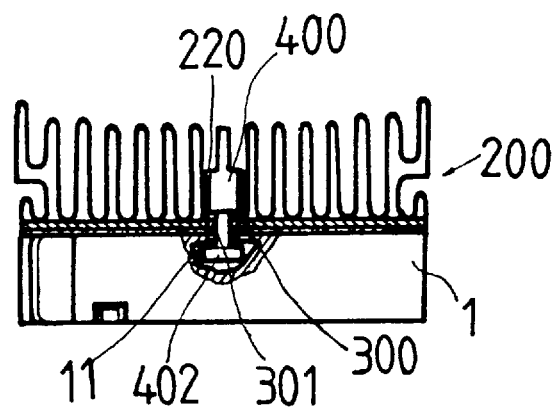
FIG. 3 is a sectional view taken along line 3—3 of FIG. 1.
Figure 4:
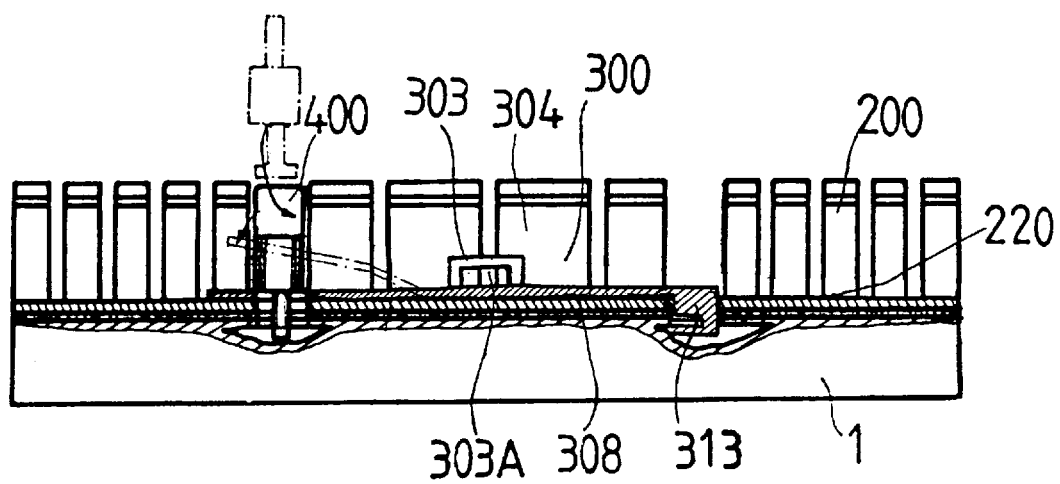
FIG. 4 is a sectional view taken along line 4—4 of FIG. 1.

Referring to FIGS. 3 and 4 and FIGS. 1 and 2 again, when the heat sink 200 is attached to the CPU shell 1, the oblong mounting holes 221, 222 are aimed at respective mounting holes 12 on the CPU shell 1, then the elongated clamping plate 300 is inserted into the longitudinal passage 220 of the heat sink 200 and secured in place by the lock bolt 400 to hold the heat sink 200 and the CPU shell 1 firmly together. When the elongated clamping plate 300 is inserted into the longitudinal passage 220 of the heat sink 200, the retainer strips 311 are respectively inserted into a respective transverse gap 223 in each array of radiating fins 211, 212, 213, 214, 215 to stop the elongated clamping plate 300 from longitudinal displacement, the upright spring frames 303 are respectively stopped against the two arrays of radiating fins 211, 212, 213, 214, 215 at an inner side to stop the elongated clamping plate 300 from transverse displacement, the downward hook 313 is inserted through one oblong mounting hole 222 of the heat sink 200 and hooked in one oblong mounting hole 12 on the CPU shell 1 to secure the heat sink 200 and the CPU shell 1 together, and the oblong mounting hole 301 of the elongated clamping plate 300 is connected to the other oblong mounting hole 221 of the heat sink 200 and a corresponding oblong mounting hole 11 of the CPU shell 1 by the lock bolt 400. When the oblong mounting hole 301 of the elongated clamping plate 300 is aimed at the corresponding oblong mounting hole 221 of the heat sink 200 and the corresponding oblong mounting hole 11 of the CPU shell 1, the T-rod 402 of the lock bolt 400 is inserted through the oblong mounting holes 301, 221, 11, and then turned through an angle of 90 degrees to lock the elongated clamping plate 300, the heat sink 200 and the CPU shell 1 together. When to unfasten the heat sink 200, turn the lock bolt 400 through an angle of 90 degree in the reversed direction for permitting the lock bolt 400 to be removed from the oblong mounting holes 301, 221, 11, and then the elongated clamping plate 300 is disconnected from the CPU shell 1 and the heat sink 200 by disengaging the downward hook 313 from the oblong mounting holes 12, 222. Because the flat finger plate 401 projects from the top of the lock bolt 400, the lock bolt 400 can be conveniently operated with the hand.

Figure 5:
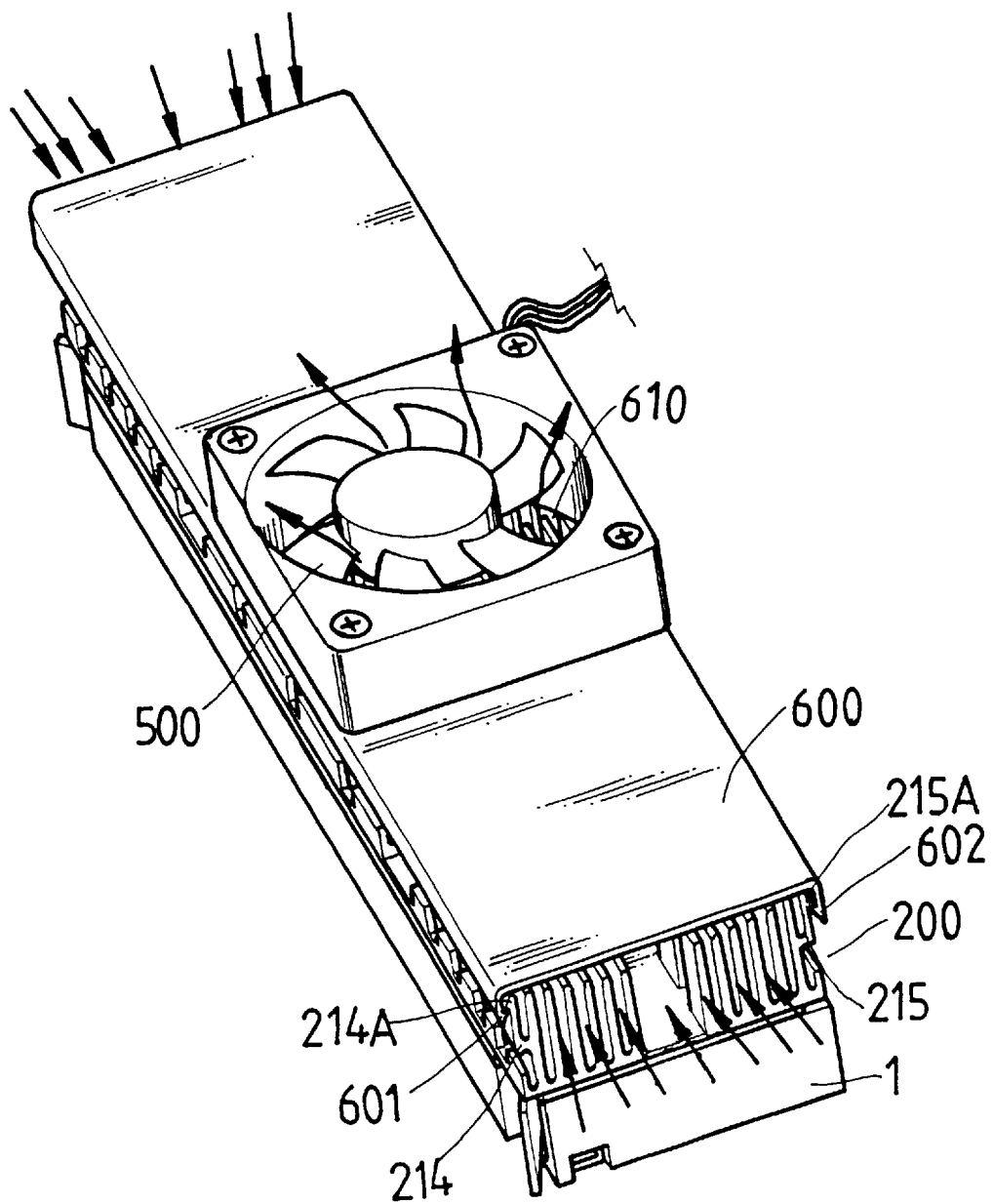
FIG. 5 is an elevational view of an alternate form of the present invention, showing a wing guide mounted on the heat sink.

Referring to FIG. 5, a wing guide 600 is mounted on the heat sink 200 to hold a fan 500. The wing guide 600 fits over the heat sink 200, having a plurality of inward hooks 601, 602 bilaterally disposed at two opposite ends and respectively hooked on respective hooked portions 214A, 215A on fin ribs 214, 215 of the radiating fins of the heat sink 200, and a center air hole 610 which receives the fan 500.

It will be understood that each of the elements described above, or two or more together may also find a useful application in other types of methods differing from the type described above.

While certain novel features of this invention have been shown and described and are.pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

I claim:

1. A CPU heat dissipating apparatus comprising a heat sink attached to a CPU shell for dissipating of heat from said CPU shell, an elongated clamping plate fastened to said heat sink and said CPU shell to secure them together, and a lock bolt fastened to said elongated clamping plate and said heat sink and said CPU shell to lock them together, wherein:

said heat sink comprises a plurality of longitudinally and transversely aligned radiating fins arranged into two separated arrays, a longitudinal passage defined between said two separated arrays of radiating fins, a first oblong mounting hole and a second oblong mounting hole disposed in said longitudinal passage and respectively connected to a respective oblong mounting hole on said CPU shell;

said elongated clamping plate comprises an oblong mounting hole at one end connected to the first oblong mounting hole of said heat sink and the corresponding oblong mounting hole of said CPU shell by said lock bolt, a downward hook at an opposite end hooked in the second oblong mounting hole of said heat sink and the corresponding oblong mounting hole of said CPU shell, and two upright springy frames bilaterally disposed in the middle and respectively stopped at said two arrays of radiating fins at an inner side;

said lock bolt comprises a flat finger plate raised from a top side thereof for the holding of the hand, and a T-rod invertedly raised from a bottom side thereof, said T-rod of said lock bolt being inserted through the oblong mounting hole of said elongated clamping plate and the first oblong mounting hole of said heat sink and the corresponding oblong mounting hole of said CPU shell and turned through 90 degrees to lock said elongated clamping plate and said heat sink and said CPU shell together.

2. The CPU heat dissipating apparatus as claimed in claim 1, wherein said elongated clamping plate comprises two retainer strips respectively and horizontally extended from a respective one of said two upright spring frames in reversed directions and inserted into a respective transverse gap in said two arrays of radiating fins to stop said elongated clamping plate from longitudinal displacement.

3. The CPU heat dissipating apparatus as claimed in claim 1, further comprising a wing guide fitting over said heat sink, said wing guide comprising a plurality of inward hooks bilaterally disposed at two opposite ends and respectively hooked on respective hooked portions on fin ribs of said radiating fins of said heat sink, and a center air hole which receives a fan.

* * * * *